(12) United States Patent
Häberlen et al.

(10) Patent No.: US 12,068,379 B2
(45) Date of Patent: Aug. 20, 2024

(54) SEMICONDUCTOR DEVICE HAVING A LATERAL TRANSISTOR DEVICE AND AN INVERTER THAT INCLUDES THE SEMICONDUCTOR DEVICE

(71) Applicant: Infineon Technologies Austria AG, Villach (AT)

(72) Inventors: Oliver Häberlen, Villach (AT); Eric G. Persson, Minnetonka, MN (US); Reenu Garg, Redondo Beach, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/326,416

(22) Filed: May 31, 2023

(65) Prior Publication Data
US 2023/0317804 A1    Oct. 5, 2023

Related U.S. Application Data (63) Continuation of application No. 17/079,615, filed on Oct. 26, 2020, now Pat. No. 11,688,777.

(30) Foreign Application Priority Data

Oct. 31, 2019    (EP) .................................... 19206668

(51) Int. Cl.
*H01L 29/41*    (2006.01)
*H01L 23/64*    (2006.01)
(Continued)

(52) U.S. Cl.
CPC ...... *H01L 29/41758* (2013.01); *H01L 23/642* (2013.01); *H01L 29/42316* (2013.01);
(Continued)

(58) Field of Classification Search
CPC ............. H01L 29/41758; H01L 23/642; H01L 29/42316; H01L 29/66446; H01L 27/0605;
(Continued)

(56) References Cited

U.S. PATENT DOCUMENTS 6,314,017 B1 * 11/2001 Emori ................... G11C 11/405
257/296
9,530,765 B1    12/2016 Moghe
(Continued)

FOREIGN PATENT DOCUMENTS

| EP | 1251563 A2 | 10/2002 |
|----|------------|---------|
| JP | H05121458 A | 5/1993 |
| JP | 2012028977 A | 2/2012 |

OTHER PUBLICATIONS

"Power MOSFET electrical Characteristics", Application Note, Toshiba, Jul. 2018. (Year: 2018).*
(Continued)

*Primary Examiner* — S M Sohel Imtiaz
(74) *Attorney, Agent, or Firm* — Murphy, Bilak & Homiller, PLLC (57) ABSTRACT

In an embodiment, a semiconductor device is provided that includes a lateral transistor device having a source, a drain and a gate, and a monolithically integrated capacitor coupled between the gate and the drain.

17 Claims, 7 Drawing Sheets

(51) Int. Cl.
*H01L 29/417* (2006.01)
*H01L 29/423* (2006.01)
*H01L 29/66* (2006.01)
*H03K 17/687* (2006.01)

(52) U.S. Cl.
CPC ... *H01L 29/66446* (2013.01); *H03K 17/6871* (2013.01); *H03K 2217/0081* (2013.01)

(58) Field of Classification Search
CPC . H01L 27/0629; H01L 28/86; H01L 23/5223; H01L 28/40; H03K 17/6871; H03K 2217/0081; H03K 17/163
See application file for complete search history.

(56) References Cited

U.S. PATENT DOCUMENTS

| | | | | |
|---|---|---|---|---|
| 2005/0064657 | A1* | 3/2005 | Miyazawa | H01L 23/5223 257/E27.048 |
| 2006/0237750 | A1 | 10/2006 | Oakes et al. | |
| 2007/0228424 | A1 | 10/2007 | Igarashi | |
| 2011/0204477 | A1* | 8/2011 | Wada | H01L 27/0207 257/532 |
| 2011/0220978 | A1 | 9/2011 | Ikeda et al. | |
| 2011/0291707 | A1 | 12/2011 | Illegems | |
| 2012/0012858 | A1 | 1/2012 | Inoue | |
| 2013/0109143 | A1* | 5/2013 | Zuniga | H01L 29/7802 438/270 |
| 2015/0041914 | A1* | 2/2015 | Lang | H03F 1/56 257/379 |
| 2015/0365001 | A1* | 12/2015 | Klesyk | H03K 17/145 363/21.01 |
| 2016/0071811 | A1* | 3/2016 | Fuh | H03K 17/693 257/532 |
| 2016/0079378 | A1* | 3/2016 | Scuderi | H03K 17/162 257/335 |
| 2016/0079979 | A1* | 3/2016 | Kinzer | H01L 27/0248 327/333 |
| 2018/0316256 | A1 | 11/2018 | Cyr et al. | |
| 2019/0181131 | A1* | 6/2019 | Galy | H01L 29/402 |
| 2019/0319023 | A1* | 10/2019 | Ranta | H01L 21/86 |
| 2020/0135638 | A1* | 4/2020 | Thollin | H01L 27/0629 |
| 2021/0203251 | A1* | 7/2021 | Benesch | H02M 7/53875 |

OTHER PUBLICATIONS

"Power MOSFET electrical Characteristics", Application Note, Toshiba, Jul. 1-11, 2018.

Ikeda, Nariaki, et al., "Power AlGaN/GaN HFETs with excellent Vb/Ron for high speed switching", Physica Status Solidi (C), vol. 5, No. 6, XP055688900 DE, ISSN: 1610-1634, DOI: 10.1002/pssc.200778443, Apr. 25, 2008, 1920-1922.

\* cited by examiner

SEMICONDUCTOR DEVICE HAVING A LATERAL TRANSISTOR DEVICE AND AN INVERTER THAT INCLUDES THE SEMICONDUCTOR DEVICE

GOVERNMENT LICENSE RIGHTS

This invention was made with government support under ARPA-E division grant number DE-AR-0000905 awarded by the United States Department of Energy. The government has certain rights in the invention.

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). Group III nitride-based semiconductor devices, such as gallium nitride (GaN) devices, are now emerging as attractive candidates to carry large currents, support high voltages and to provide very low on-resistance and fast switching times.

In some applications, such as inverters, it would be useful to be able to control the turn on/turn off speed, that is the dv/dt or slew rate, to a target value. For silicon transistors, a gate resistor is typically used to control the switching speed. Active gate control has also been used in silicon devices to control and slow down dv/dt. It would also be desirable to be able to control the slew rate in other types of semiconductor devices, such as Group III nitride-based transistor devices.

SUMMARY

According to the invention, a semiconductor device is provided that comprises a lateral transistor device having a source, a drain and a gate, and a monolithically integrated capacitor coupled between the gate and the drain. The semiconductor device comprises a reverse transfer capacitance $C_{rss}$, wherein $C_{rss(Vds=0V)}/C_{rss(Vds=400V)} < 50$ In some embodiments, the lateral transistor device is a III-V semiconductor transistor device, such as a Group III nitride-based transistor device, for example a Group III nitride-based High Electron Mobility Transistor.

In some embodiments, the semiconductor device comprises a semiconductor body having a first surface, the lateral transistor device comprises a source finger electrode, a drain finger electrode and a gate finger electrode arranged on the first surface of the semiconductor body, the gate finger electrode being arranged laterally between the source finger electrode and the drain finger electrode, and a metallization structure arranged on the first surface, and the capacitor is integrated into the metallization structure and coupled between the gate finger electrode and the drain finger electrode.

In some embodiments, the capacitor is formed on the first surface and comprises a first plate formed from a first conductive layer of the metallization structure, a second plate formed from a second conductive layer of the metallization structure, the first and second conductive layers being spaced apart from another by a first insulation layer of the metallization structure.

In some embodiments, the lateral transistor device comprises an active area that contributes to current switching and the capacitor is positioned laterally adjacent to the active area.

In some embodiments, the capacitor is arranged on the first surface laterally adjacent the source finger electrode, the drain finger electrode and the gate finger electrode.

In some embodiments, the first plate of the capacitor extends from a gate runner formed from the first conductive layer, the gate runner being electrically coupled to the gate finger electrodes or the first plate extends from a gate pad formed from the first conductive layer, the gate pad being electrically coupled to the gate finger electrode, and the second plate of the capacitor extends from a drain bus formed from the second conductive layer, the drain bus being electrically coupled to the drain finger electrode.

In some embodiments, the lateral transistor device comprises an active area that contributes to current switching and the capacitor is positioned above the active area.

In some embodiments, the capacitor is arranged at least partially above the source finger electrode.

In some embodiments, the metallization structure further comprises a third conductive layer, the third conductive layer comprising a source finger arranged on the source finger electrode, a drain finger arranged on the drain finger electrode, and a gate runner that is positioned laterally adjacent the gate finger electrode, the source finger electrode and the drain finger electrode. The first conductive layer is arranged above the source finger and is insulated from the source finger by a second insulation layer.

In some embodiments, the second conductive layer comprises alternate drain and source buses that are arranged vertically above the source finger and the drain finger and extend substantially perpendicularly to the source finger and the drain finger. The source finger is coupled to the source bus by a first conductive via extending through the first insulation layer, and the drain finger is coupled to the drain bus by a second conductive via extending through the first insulation layer.

In some embodiments, the semiconductor device further comprises a third insulation layer that is positioned between the source finger and the drain finger of the third conductive layer and a fourth insulation layer arranged on the first surface that extends between the source finger electrode and the drain finger electrode and covers the gate finger electrode, wherein the third insulation layer is arranged on the fourth insulation layer.

In some embodiments, the first conductive layer is coupled to the gate runner by a third conductive via that extends through the third and fourth insulation layers.

In an embodiment, an inverter is provided that comprises one or more half bridge circuits, each comprising a first switch coupled in series with a second switch. At least one of the first switch and the second switch comprises a semiconductor device comprising a lateral transistor device having a source, a drain and a gate, and a monolithically integrated capacitor coupled between the gate and the drain.

In some embodiments, the inverter is a voltage source inverter for a motor drive.

In some embodiments, the inverter further comprises gate driver circuitry for actively controlling gate current of at least one of the first switch and the second switch.

In some embodiments, the gate driver circuitry is multi-level current controlling gate driver circuitry in which a first current level is used at start on and a second current level is used to maintain the current.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off. An enhancement-mode device is not limited to low voltages and may also be a high-voltage device.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where 0<x<1.

For applications in which it is desirable to control the slew rate or dv/dt of a silicon transistor device, various approaches can be used. For example, a gate resistor may be used. This gate resistor acts against the inherent gate drain capacitance, CGD, or Miller capacitance to provide slew rate control. However, for other types of semiconductor devices, such as III-V semiconductor device and Group III nitride-based transistor devices, a gate resistor leads to high losses. This is a result of CGD being nonlinear for Group III nitride-based devices which leads to the slew rate being non-linear. Therefore, if the fastest portion of the switching speed is limited to a certain value, the overall switching speed becomes slower than desirable and to higher losses. Additionally, the slew rate is dependent on the load current.

One approach for controlling the slew rate in III-V semiconductor devices and Group III nitride-based devices, such as Group III nitride based HEMTs is to control the gate drive current to compensate for the nonlinearity in CGD and achieve a slew rate that is more linear.

A further approach for controlling the slew rate in III-V semiconductor devices and Group III nitride-based devices, such as Group III nitride based HEMTs is to include an additional capacitance that is coupled in parallel with the inherent gate drain capacitance Ca). The additional capacitance is linear so that the characteristic of the combined parallel capacitance is dominated by the additional linear capacitor and dv/dt is thus linearized. Whilst this approach may result in an increase in the total gate charge, the gate charge for Group III nitride-based transistor devices is low so that any increase in gate charge is acceptable as the total gate charge is still low in comparison with other types of semiconductor devices, such as silicon-based transistor devices.

The additional capacitance may be provided by an external capacitor. An external capacitor may lead to an increase in size and also in a requirement for additional pins in the package of the transistor device for connecting the external capacitor to the transistor device.

According to embodiments described herein, an additional capacitor that is coupled between drain and gate of the III-V transistor device, e.g. Group III nitride-based transistor device, is integrated into the semiconductor device. The additional capacitor may be integrated into the metallization structure arranged on a major surface of the semiconductor device including the transistor device and may be monolithically integrated into the metallization structure. Thus, a linearizing capacitor can be added to the equivalent circuit without requiring extra pins or significantly increasing the size occupied so that the slew rate is linearized and more accurately controllable.

A transistor device comprises a reverse transfer capacitance $C_{rss}$, which is a dynamic characteristic of the transistor device that is dependent on the drain-source voltage $V_{ds}$. By including an additional capacitor coupled between gate and drain, the value of $C_{rss}$ at a particular value of $V_{ds}$ is increased due to the linearizing effect of the additional capacitor. In some embodiments, the ratio between $C_{rss}$ at a drain source voltage of 0 V, i.e. $C_{rss(Vds=0V)}$, and $C_{rss}$ at a drain source voltage of 400 V, i.e. $C_{rss(Vds=400V)}$, is less than 50, or less than 20. In some embodiments, the ratio between $C_{rss}$ at a drain source voltage of 0 V, i.e. $C_{rss(Vds=0V)}$, and $C_{rss}$ at a drain source voltage of 200 V, i.e. $C_{rss(Vds=200V)}$ is less than 20.

For a comparison transistor device without the additional capacitor coupled between gate and drain, the ratio between $C_{rss}$ at a drain source voltage of 0 V, i.e. $C_{rss(Vds=0V)}$, and $C_{rss}$ at a drain source voltage of 400 V, i.e. $C_{rss(Vds=400V)}$, is greater than 100. For a comparison gallium nitride based HEMT without the additional capacitor coupled between gate and drain, $C_{rss(Vds=0V)}/C_{rss(Vds=400V)}$, may be greater than 500.

Figure 1:
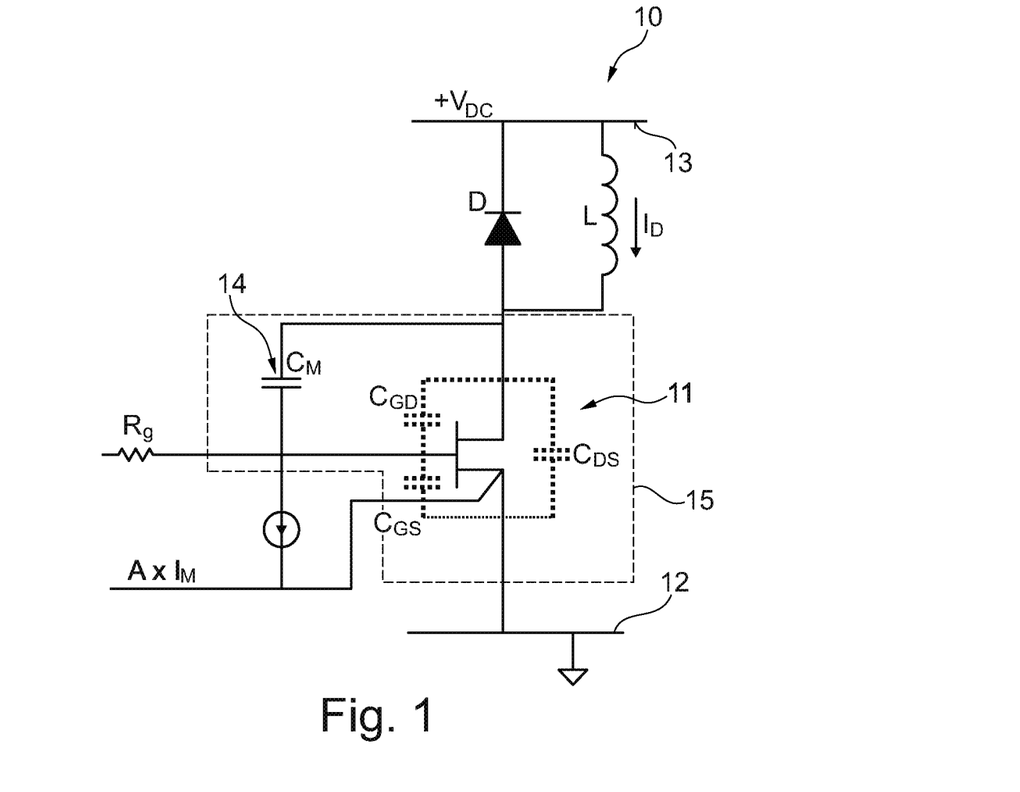
FIG. 1 illustrates an equivalent circuit diagram of a transistor device including an additional capacitor.

FIG. 1 illustrates an equivalent circuit diagram 10 of a transistor device 11 with a controllable slew rate or dv/dt. The transistor device 11 may be a lateral transistor device, for example a III-V semiconductor device and in some embodiments is lateral a Group III nitride-based transistor device such as a Group III nitride-based HEMT (High Electron Mobility Transistor).

The transistor device 11 has a source connected to a low voltage bus 12, which may be ground, and a drain connected to high-voltage bus 13. The transistor device 11 includes an inherent drain source capacitance $C_{DS}$, an inherent gate source capacitance, $C_{GS}$, and an inherent gate drain capacitance $C_{GD}$. An additional capacitor 14 is coupled between the drain and gate of the transistor device 11 and is also is coupled in parallel with the inherent gate drain capacitance CGD of the transistor device 11. The additional capacitor 14 has a capacitance $C_M$ which is greater than the capacitance $C_{GD}$. For example, the capacitance $C_M$ of the additional capacitor 14 can be at least 10 times larger than $C_{GD}$.

In this circuit, the discharging and charging time of the additional capacitor 14 is variable and dv/dt is controllable and can be slowed down to provide a desired value. The capacitance of the additional capacitor 14 can be selected so as to linearize dv/dt. The additional capacitor 14 coupled between the drain and the gate and is coupled in parallel with the inherent gate drain capacitance $C_{GD}$. This has the effect of linearizing the dv/dt slope which enables dv/dt to be controlled more accurately and the switching speed of the transistor 11 to be set at a desired value.

As used herein, a transistor device will be described as having a source, a drain and gate. These terms also encompass the functionally equivalent terminals of other types of devices, such as an insulated gate bipolar transistor. For example, as used herein, the term "source" encompasses not only a source of a MOSFET device but also an emitter of an insulator gate bipolar transistor (IGBT) device and an emitter of a BJT device, the term "drain" encompasses not only a drain of a MOSFET device but also a collector of an insulator gate bipolar transistor (IGBT) device and a collector of a BJT device, and the term "gate" encompasses not only a gate of the MOSFET device but also a gate of an insulator gate bipolar transistor (IGBT) device and a base of a BJT device.

According to embodiments described herein, the additional capacitor 14 is integrated into the semiconductor device which includes the transistor device 11 as is indicated by the dashed line 15 in FIG. 1. The additional capacitor 14 may be monolithically integrated into the semiconductor device which includes the transistor device 11. In some embodiments, the capacitor 14 is monolithically integrated into the metallization structure of the semiconductor device and/or transistor device 11. In some embodiments, the transistor device is a lateral transistor device.

This semiconductor device may be used in applications such as inverters which include one or more half bridge circuits, each half bridge circuit comprising a first switch coupled in series with a second switch. The first switch may be the low side switch and the second switch the high side switch of the half bridge circuit. At least one of the first switch and the second switch may be provided by the transistor device 15 with the additional capacitor 14 coupled between drain and gate so that the overall gate-drain capacitance and, consequently, slew rate or dv/dt of the transistor device 15 is linearized and the switching speed is more accurately controllable.

In a half bridge circuit, the source of the low side switch or first transistor device, is coupled to low-voltage bus, for example ground, the drain of the low side switch is coupled to the source of the high side switch via an output node which may be coupled to a load which is to be driven by the half bridge circuit and the drain of the high side switch is coupled to high-voltage bus.

The inverter may be a voltage source inverter for a motor drive, for example. In some embodiments, the inverter further comprises gate driver circuitry. In some embodiments, the gate driver circuitry is configured to actively control the gate current. In some embodiments, the gate driver circuitry is multilevel current controlling gate driver circuitry in which a first current level is used at start on and a second current level is used to maintain the current.

Figure 2:
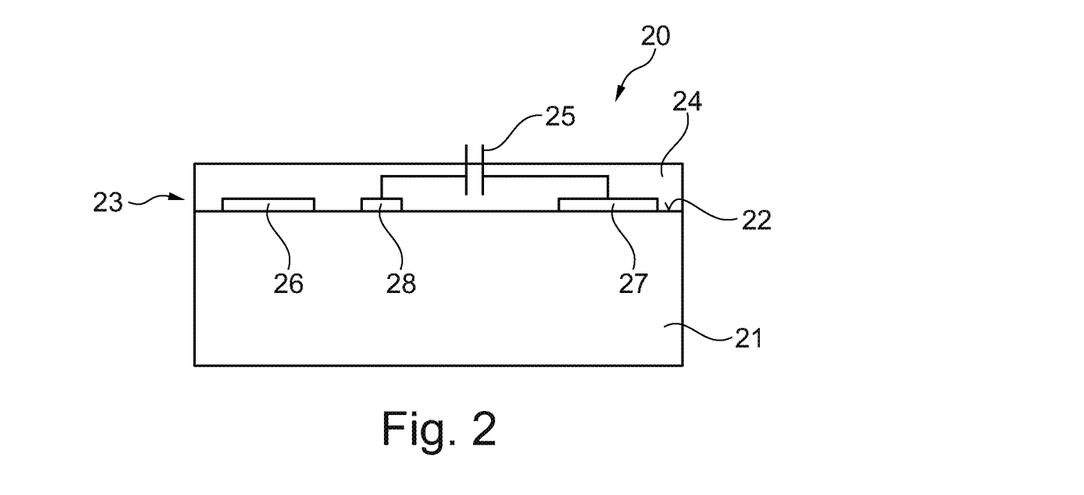
FIG. 2 illustrates a schematic view of a semiconductor device including a transistor device and an integrated capacitor.

FIG. 2 illustrates a schematic view of a semiconductor device 20. The semiconductor device 20 may provide the equivalent circuit of the device 15 schematically indicated in FIG. 1.

The semiconductor device 20 comprises a semiconductor body 21 having a first surface 22, a lateral transistor device 23 formed in the semiconductor body 21 and metallisation structure 24 arranged on the first surface 22. A capacitor 25 is integrated into the semiconductor device 20, for example into the metallisation structure 24.

The lateral transistor device 23 includes a source electrode 26, a drain electrode 27 and a gate electrode 28 arranged on the first surface 22. The gate electrode 28 is arranged laterally between the source electrode 26 and the drain electrode 27. The capacitor 25 is electrically coupled between the drain electrode 27 and the gate electrode 28.

The lateral transistor device 23 may be a III-V semiconductor device so that the semiconductor body 21 comprises one or more III-V semiconductor materials. In some embodiments, the lateral transistor device 23 is a Group III nitride-based semiconductor device so that the semiconductor body 21 comprises one or more Group III nitride materials.

Typically, the lateral transistor device 23 includes a plurality of source electrodes 26, drain electrodes 27 and gate electrodes 28 and the capacitor 25 is electrically coupled between the drain electrodes 27 and the gate electrodes 28. In some embodiments, the lateral transistor device 23 comprises source finger electrodes, drain finger electrodes and gate finger electrodes arranged on the first surface 22 of the semiconductor body 21. In these embodiments, the capacitor 25 is integrated into the metallisation structure 24 and electrically coupled between the gate finger electrodes and the drain finger electrodes.

An additional linear capacitor 25 is used which is coupled between gate and drain electrodes of the transistor device 23 and in parallel with the inherent gate drain capacitance $C_{GD}$ of the transistor device 23 in order to linearize dv/dt without occupying additional space external to the semiconductor device 20. Since the transistor device 23 is a lateral device, all three electrodes, that is source, drain and gate, are conveniently positioned on a common first surface 22, thus simplifying integration of the capacitor 25 into the metallisation structure 24 and into the portions of the metallization structure 24 that are coupled to the drain and gate electrodes.

The additional linearizing capacitor 25 may be integrated into the metallization structure 24 in different ways. Various embodiments will be now described with reference to FIGS. 3A through 5B.

FIGS. 3A to 3F illustrate a semiconductor device 30 including a lateral transistor device 31 according to an embodiment.

In some embodiments, the semiconductor device 30 is a III-V semiconductor device and in some embodiments, such as that illustrated in FIG. 2, the semiconductor device 30 is a Group III nitride-based semiconductor device. The transistor device 31 may be a Group III nitride-based HEMT (High Electron Mobility Transistor) device. The transistor device 31 may be a high voltage device having a blocking voltage of 600V or more and may be an enhancement mode device or a depletion mode device.

The semiconductor device 30 has a semiconductor body 45 with a first or top surface 46. In the plan view of FIG. 3A, it can be seen that the transistor device 31 includes an active area or cell field 38. A plurality of source fingers 32 alternately arranged with a plurality of drain fingers 33 are positioned on the first surface 46 of the semiconductor device 30. Each of the source fingers 32 and drain fingers 33 are elongate and extend substantially parallel to one another. The source fingers 32 are electrically coupled to a common source pad 34 arranged adjacent a first lateral side of the cell field 38 and the drain fingers 33 are electrically coupled to a common drain pad 35 arranged on the opposing side of the cell field 38 by a drain bus 44. This arrangement of the source and drain fingers 32, 33 is also referred to as an interdigitated arrangement.

Figure 3A:
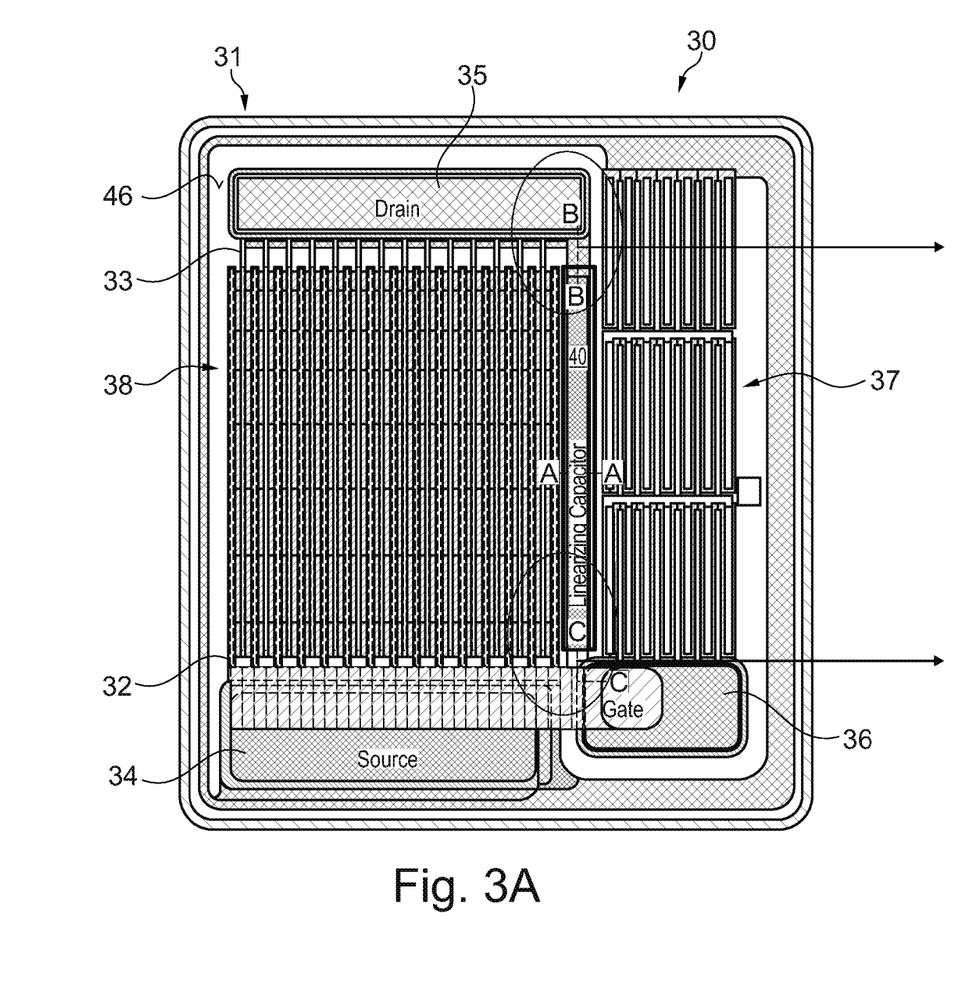
FIG. 3A illustrates a plan view of a semiconductor device according to an embodiment including a transistor device that includes a linearizing capacitor.

A gate electrode finger, which cannot be seen in the plan view of FIG. 3A, is positioned laterally between a source finger 32 and drain finger 33 and is electrically coupled to a gate pad 36 by a gate runner 39. The gate runner 39 extends along the first lateral side of the cell field 38 to connect the gate finger electrodes to the gate pad 36. The gate pad 36 is arranged laterally adjacent to and spaced apart from the cell field 38.

In the embodiment illustrated in FIGS. 3A through 3F, the semiconductor device 30 also includes a diode 37 for ESD protection which is positioned adjacent one lateral side of the cell field 38 and the transistor device 31.

An additional linearizing capacitor 40 is arranged on the first surface 46 that is electrically coupled between the drain fingers 32 and the gate runner 39. In this embodiment, the additional linearizing capacitor 40 is positioned laterally adjacent the cell field 38 and laterally adjacent to the outermost finger, in this case a source finger of the cell field 38. In this embodiment, the additional linearizing capacitor 40 is positioned laterally between the cell field 38 and the diode 37 and on the first surface 46. In this embodiment, capacitor 40 has an elongate shape in plan view. However, the shape of the capacitor 40 and its position on the first surface of the semiconductor device 30 may vary depending on the space available on the top surface 46 of the semiconductor device 30.

Figure 3B:
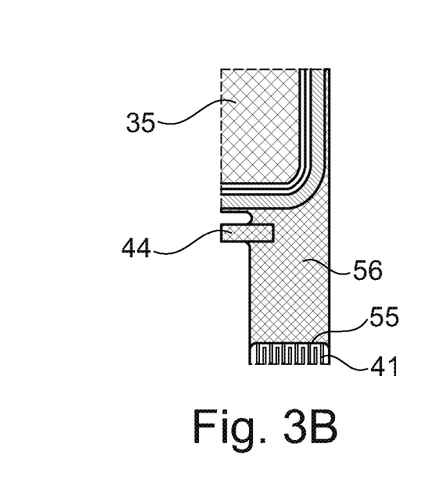
FIG. 3B illustrates an enlarged plan view of the connection between the linearizing capacitor and drain metal.
Figure 3C:
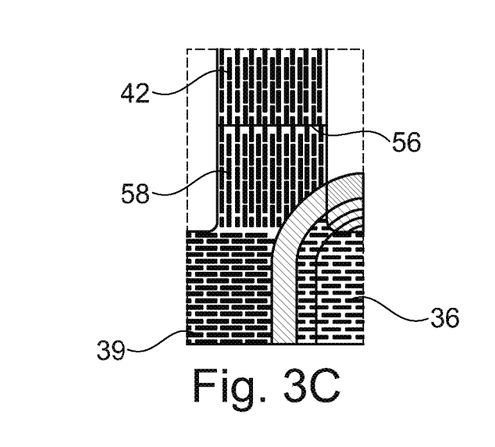
FIG. 3C illustrates an enlarged plan view of the connection between the linearizing capacitor and gate metal.

As can be more clearly seen in the enlarged plan views of FIGS. 3B and 3C, the capacitor 40 includes a first or bottom plate 41, a second or top plate 42 arranged vertically above the first plate 41 and a dielectric 43 arranged between the first plate 41 and the second plate 42. The first plate 41 comprises a conductive material which is connected to the gate pad 36 of the transistor device 31. In some embodiments, the first plate 41 may be formed by an extension 45 of the gate runner 39. In the design of FIGS. 3A through 3F, the extension 45 may be substantially perpendicular to the gate runner 39. The gate pad 36 is positioned on top of the gate runner 39.

As can be seen in the enlarged plan view of FIG. 3C, the second plate 42 of the capacitor 40 is formed by a portion of a conductive layer forming the drain bus 44. The drain bus 44 extends substantially perpendicularly to the drain fingers 33 laterally adjacent the cell field 38 and electrically couples the drain fingers 33 to one another. In this embodiment, the second plate 42 of the capacitor 40 is formed by an extension of the drain bus 44 on the first surface 46 that extends substantially perpendicularly to the drain bus 44 and substantially parallel to the drain fingers 33. In some embodiments, the drain bus 44 and the second plate 42 are formed from a titanium nitride layer. The drain pad 35 is formed on the drain bus 44 and may include a metal, for example copper.

The vertically overlapping region between the first plate 41 provided by the extension 45 of the gate runner 39 and the second plate 42 provided by the extension of the drain bus 44 can be adjusted to provide the desired value of the capacitance of the linearizing capacitor 40.

The semiconductor device 30 includes a metallization structure on the first surface 46 that includes a first conductive layer that is structured to form the gate runner 39, the first plate 41 of the capacitor 40 and the source and drain fingers 32, 33 positioned on the underlying source and drain finger electrodes. The metallization structure also includes a dielectric layer 43 that is positioned on the first conductive layer and a second conductive layer that is positioned on the dielectric layer 43. The second conductive layer is structured to form the drain bus 44 and the second plate 42 of the capacitor 40. The metallization structure also includes a further conductive layer on the second conductive layer that provides the source pad 34, drain pad 35 and gate pad 36.

Therefore, the additional capacitor 40 is monolithically integrated into the metallisation structure arranged on the first surface 46 of the semiconductor device 30 by appropriately structuring the masks using to fabricate the metallisation structure. In this embodiment, the capacitor 40 is monolithically integrated into the metallization structure without including any extra layers exclusively for the capacitor 40.

Figures 3D, 3E, 3F:
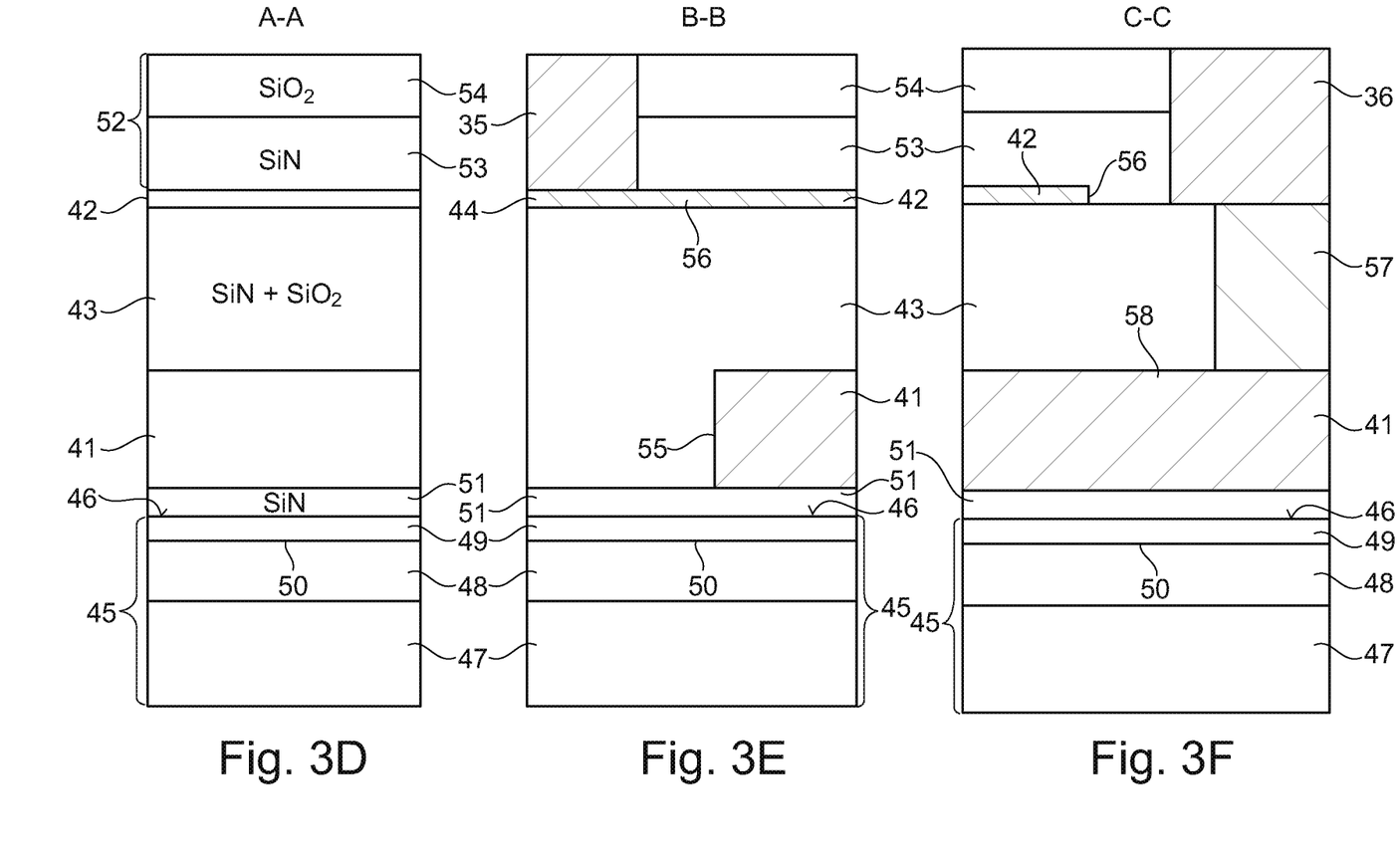
FIG. 3D illustrates a cross-sectional view along the line A-A of FIG. 3A.
FIG. 3E illustrates a cross-sectional view along line B-B of FIG. 3A.
FIG. 3F illustrates a cross-sectional view along the line C-C FIG. 3A.

FIG. 3D illustrates a cross-sectional view along the line A-A of FIG. 3A and illustrates a cross-sectional view of a central region of the capacitor 40. In FIG. 3D, it can be seen that the semiconductor device 30 includes the semiconductor body 45 including the first or top surface 46. The semiconductor device 30 is a Group III nitride-based device and includes a multilayer Group III nitride structure in which a transition layer 47 is arranged on a non-illustrated substrate, a channel layer 48 is positioned on the transition layer 47 and a barrier layer 49 is positioned on the channel layer 48 to from a heterojunction 50. The channel layer 48 may comprise gallium nitride and the barrier layer 49 may comprise aluminium gallium nitride so that a heterojunction 50 is formed between the channel layer 48 and the barrier layer 49 that is capable of supporting a two-dimensional carrier gas.

The dielectric layer 43 of the capacitor 40 is positioned on the first plate 41 and the second plate 42, which is connected to the drain bus 44 and the drain pad 35, is positioned on the dielectric layer 43. The conductive layer, which provides the first plate 41 of the capacitor 40 and the gate runner 39, is electrically insulated from the barrier layer 49 of the semiconductor body 45 by an insulating layer 51 which may be formed of silicon nitride, for example. The first conductive layer and, therefore, the first plate 41 and the gate runner 39 may include a metal, such as copper. The dielectric layer 43 may include be formed of silicon nitride and/or silicon dioxide. The second plate 42 and drain bus 44 may include titanium nitride or a metal.

Also illustrated in FIG. 3D is a passivation layer 52 which is positioned on the second plate 42. The passivation layer 52 may include two or more sublayers. In the example illustrated in FIG. 3D, the passivation layer 52 includes a silicon nitride sublayer 53 positioned on the second plate 42 and a silicon dioxide sublayer 54 positioned on the silicon nitride sublayer 53.

FIG. 3E illustrates a cross-sectional view along line B-B of FIG. 3A and a cross-sectional view along the length of a portion of the capacitor 40 and the connection between the second plate 42 of the capacitor 40 and the drain pad 35.

FIG. 3E illustrates that the bottom first plate 41 of the capacitor 40 that is coupled to the gate pad 36 has a distal end 55 which is laterally spaced apart from the drain pad 35. The conductive layer forming the second plate 42 has a connection region 56 that extends laterally beyond the distal end 55 of the first plate 41 and under the drain pad 35. The connection region 56 is in direct contact with the drain pad 35 to electrically connect the second plate 42 to the drain pad 35. Vertically underneath the drain pad 35 and the connection region 56 of the second plate 42, the semiconductor body 45 includes only insulating material in the space between the connection region 56 and the top surface 46 of the semiconductor body. The area of the capacitor 40 and, therefore, the capacitance provided, is limited at this end of the capacitor 40 by the lateral extent of the first plate 41.

FIG. 3F illustrates a cross-sectional view along the line C-C FIG. 3A and illustrates a cross-sectional view at the opposing end of the capacitor 40. FIG. 3F illustrates that the second plate 42 has a distal end 56 that is spaced apart from the gate pad 36. The conductive layer providing the first plate 41 includes a connection region 58 that extends under the gate pad 36 and is spaced apart from the gate pad 36 by the dielectric layer 43. A conductive via 57 is provided that vertically extends between the connection region 58 of the first plate 41 and the gate pad 36 and electrically couple the first plate 41 to the gate pad 36 and to the gate fingers of the transistor device. The area of the capacitor 40 is, therefore, limited by the lateral extent of the second plate 42 at this end of the capacitor 40.

Figure 4A:
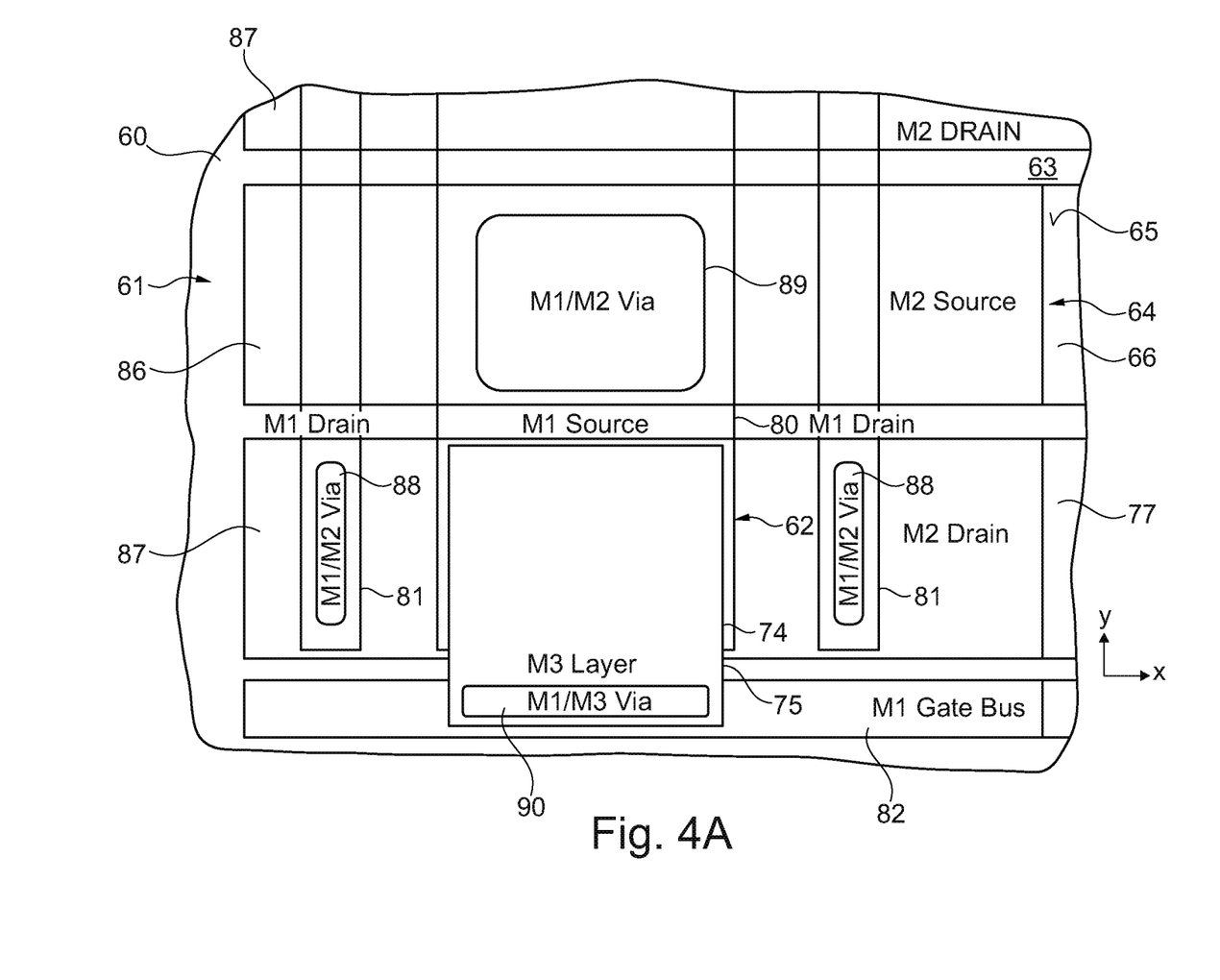
FIGS. 4A and 4B illustrate a plan view and a cross-sectional view, respectively, of a semiconductor device according to an embodiment including a lateral transistor device and a linearizing capacitor.
Figure 4B:
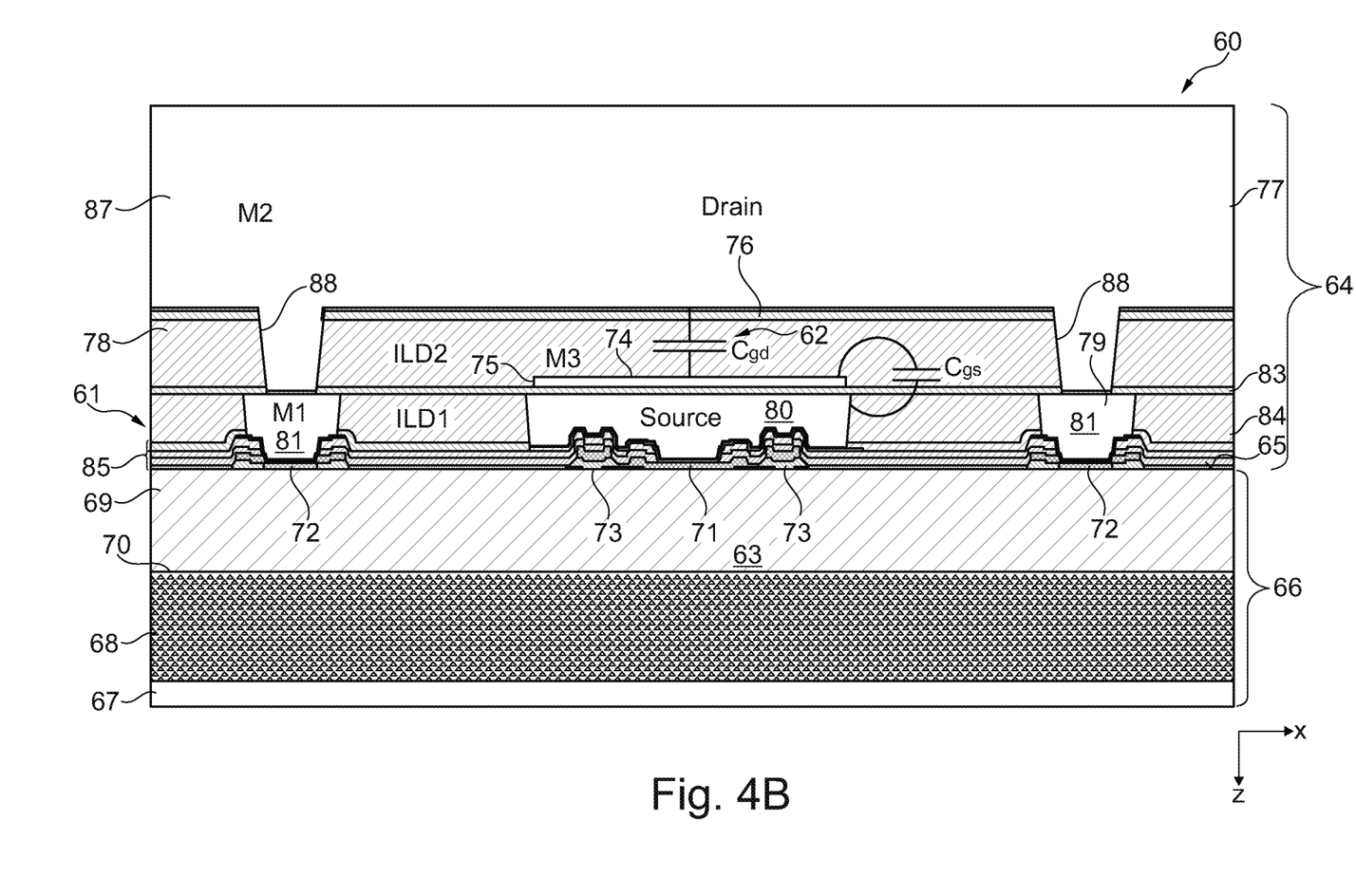

FIGS. 4A and 4B illustrate a plan view and a cross-sectional view, respectively, of a semiconductor device 60 including a lateral transistor device 61 according to an embodiment. The transistor device 61 includes a capacitor 62 which is integrated into a metallisation structure 64 positioned on a first surface 65 of semiconductor body 66 of the semiconductor device 60. In this embodiment, the capacitor 62 is positioned on the active area 63 of the transistor device 61 and above the cell field.

Referring to the cross-sectional view of FIG. 4B, the semiconductor body 66 is a Group III nitride-based semiconductor body which includes a transition structure 67 arranged on a non-illustrated substrate, a channel layer 68 arranged on the transition layer 67 and a barrier layer 69 arranged on the channel layer 68 such that a heterojunction 70 is formed at the interface between the channel layer 68 and the barrier layer 69. The channel layer 68 may comprise gallium nitride and the barrier layer 69 may comprise aluminium gallium nitride and the heterojunction 70 formed between the channel layer 68 and the barrier layer 69 is capable of supporting a two-dimensional charge gas, such as a two-dimensional electron gas (2DEG).

The transistor device 61 includes source finger electrodes 71 drain finger electrodes 72 and gate finger electrodes 73 which are arranged on the first surface 65 of the semiconductor body 66. The transistor device 61 is, therefore, a lateral transistor device with a conductive channel which extends substantially parallel to the first surface 65.

The source finger electrodes 71, the drain finger electrodes 72 and the gate finger electrodes 73 each have an elongate form which extends into the plane of the drawing of FIG. 4A in the cross-sectional view of FIG. 4B. Using a Cartesian coordinate system with the plane of the drawing of FIG. 4A in the x-y plane, the source finger electrode 71, the drain finger electrode 72 and the gate finger electrode 73 each have a length extending in the y direction, a width extending in the x direction and a thickness extending in the z direction.

In the view illustrated in FIGS. 4A and 4B, a single source electrode 71 is illustrated with a gate finger electrode 65 positioned adjacent two opposing sides of the source finger electrode 71 and a drain electrode 72 is positioned adjacent each gate finger electrode 73 such that the gate finger electrode 73 is laterally positioned between the source finger electrode 71 and one of the drain finger electrodes 72.

The source finger electrode 71, drain finger electrode 72 and gate finger electrode 73 are not illustrated in the plan view of FIG. 4A which illustrates on the structure of the metallisation layer 64 arranged on the first surface 65 of the semiconductor body 66 and on the source finger electrode 71, the drain finger electrode 72 and the gate finger electrode 73.

The capacitor 62 is positioned above the source finger electrode 71 and includes a first plate 74 formed from a first conductive layer 75 of the metallisation structure 64 and a second plate 76 which is formed from a second conductive layer 77 of the metallisation structure 64. The first and second conductive layers 75, 77 are spaced apart from one another by a first insulating layer 78 of the metallisation structure 64 which also forms the dielectric of the capacitor 62.

The metallisation structure 64 further includes a third conductive layer 79 which is positioned between the first conductive layer 75 and the first surface 65 of the semiconductor body 66. The third conductive layer 79 comprises a source finger 80 which is arranged on the source finger electrode 71 and a drain finger 81 which is positioned on the drain finger electrode 72. The third conductive layer 79 also includes a gate runner 82, which can be seen in the plan view of FIG. 4A, which is positioned laterally adjacent the gate finger electrodes 73, source finger electrodes 71 and drain finger electrodes 81. In particular, the gate runner 82 extends substantially perpendicularly to the long length of the source finger 71, drain finger 72 and gate finger 73 and in the x direction and is spaced apart from a distal end of the source finger 71 and drain fingers 72. The gate finger electrodes 73 extend to and are connected with the gate runner 82 so that the gate runner 82 electrically couples the gate finger electrodes 73 to one another.

The first conductive layer 75 and, in particular, the first plate 74 of the capacitor 62 is positioned above the third conductive layer 79 and vertically above the source finger 80. The first plate 74 is electrically insulated from the underlying source finger 80 and from source finger electrode 71 by a second insulating layer 83. In some embodiments, the second insulating layer 83 may comprise silicon nitride and may be much thinner than the first insulating layer 78 which is positioned between the conductive plates 74, 76 of the capacitor 62.

The source finger 80 has a width which is greater than the width of the source finger electrode 71 and may have a width such that it is positioned above the gate finger electrodes 73. The metallisation structure 64 further includes a third insulating layer 84 which is positioned between the source fingers 80 and gate fingers 81 and a fourth insulating layer 85 which is positioned on the first surface 65 and extends between the source fingers 80 and the drain fingers 81 and also covers the gate finger electrodes 73 so as to electrically insulate the gate finger electrodes 73 from the overlying source finger 80.

As can be seen in the plan view of FIG. 4A, the source fingers 80 also have an elongate shape and are spaced apart from the drain fingers 81 which also have an elongate shape.

The source fingers 80 and the drain fingers 81 have a long direction extending in the y direction and a width extending in the x direction.

The metallisation structure 64 includes a second conductive layer 77 which is used to electrically couple the source fingers 80 to one another and the drain fingers 81 to one another. Referring to FIG. 4A, the second conductive layer 77 is structured to provide at least one source bus 86 and at least one drain bus 87 which are laterally spaced apart from one another and which have a long direction extending in the x direction and perpendicularly to the long directions of the source fingers 80 and drain fingers 81. The source and drain buses 86, 87 are arranged alternately in the y direction.

The source bus 86 and the drain bus 87 are elongate and extend substantially perpendicular to the source fingers 80 and drain fingers 81 and have a lateral extent such that they extend over at least two if not more source fingers 80 and drain fingers 81. The drain bus 87 extends over the source finger 80 and is electrically coupled to the drain fingers 81 positioned on opposing sides of the source finger 80 by conductive vias 88 which extend through the first insulating layer 78. The drain bus 87 is electrically insulated from the source finger by the first insulating layer 78. Similarly, the source bus 86 extends over the drain fingers 81 and is electrically insulated from the drain fingers 81 by the first insulating layer 78. The source bus 86 is electrically coupled to the source finger 80 by a conductive via 89 which extends from the source bus to the source finger 80 through the first insulating layer 78. The conductive vias 88, 89 have an off-set arrangement. The conductive via 89 from the source finger 80 is positioned laterally adjacent and spaced apart in the y direction from the first plate 74 of the capacitor 62 which is also positioned on the source finger 80, but spaced apart and insulated from the source finger 80 by the second insulation layer 83.

Using the Cartesian coordinate system, the plan view of FIG. 4A may be considered to be in the x-y plane, whereby the source electrode fingers 71, drain electrode fingers 72, gate electrode finger 73, the source fingers 80 and the drain fingers 81 of the third conductive layer 79 extend in the y direction and the source bus 86, drain bus 87 of the second conductive layer 77 and the gate bus 82 of the third conductive layer 79 extend in the x direction. The z direction extends substantially perpendicularly to the first major surface 65 of the semiconductor body 66 such that the conductive vias 88, 89 and 90 extend in the z direction.

The first conductive layer 75 has a lateral extent which corresponds to the lateral extent of the width of the first plate 74 of the capacitor 62. As can be seen in the plan view of FIG. 4A, the first conductive layer 75 extends beyond the distal end of the source finger 80 and is positioned above the gate runner 82 which is formed in the underlying third conductive layer 79. The first conductive layer 75 and the first plate 74 of the capacitor 74 is electrically coupled to the gate bus 82 by a conductive via 90 which extends through the first insulating layer 78 that is positioned between the first conductive layer 75 and the gate runner 82.

The capacitor 62 is formed within the active area of the transistor device 61 since it is positioned above the source finger 80 of the third conductive layer and the drain bus 87 of the second conductive layer 77. A capacitor having a form corresponding to that of the capacitor 62 may be positioned above some or all of the source fingers 80 of the transistor device 61.

In the embodiment illustrated in FIGS. 4A and 4B, the width of the first plate of the capacitor 62 in the x direction is slightly less than the width in the x direction of the underlying source finger 80 such that the top edges of the source finger 80 are surrounded by the first insulating layer 78, the second insulating layer 83 and the third insulating layer 84.

The capacitor 62 includes a first plate 74 which is formed from the first conductive layer 75 and a second plate 76 which is formed from a portion of the second conductive layer 77 that also forms the drain bus 87. The dielectric of the capacitor 62 is formed by a portion of the first insulating layer 78 that also serves as an interlayer dielectric of the metallization structure 64 that electrically insulates the second conductive layer 77 from the underlying third conductive layer 79 and, in particular, the drain bus 87 from the underlying source fingers 80 and the source bus 86 from the underlying drain fingers 81.

In this embodiment, an additional conductive layer 75 is included in the metallization structure for the transistor device 61 to form the first plate 74 which does not form any part of the redistribution structure between one of the electrodes of the transistor device 61 and outer contact pads. The first conductive layer 75 forming the first plate may be used exclusively for the purpose of monolithically integrating the capacitor 62 into the metallization structure 64 at a positioned above the cell field and active area 63 of the transistor device 61.

The first plate 74 is coupled to the gate electrode fingers by means of an extension of the first plate 74 in the y direction to above the gate runner 82 and the conductive via 90. The second plate 76 is formed from the portion of the drain bus 87 overlying the first plate 74 and is coupled to the drain fingers electrodes 72 by way of the conductive via 89 and drain fingers 81. The capacitor 62 provides a linear capacitance that is coupled in parallel with the inherent gate drain capacitance of the transistor device 61 so that the combined gate drain capacitance is linearized and dv/dt is linearized, thus enabling accurate control of the slew rate.

The source buses 86 are spaced apart from one another by laterally intervening drain buses 87. The source buses 86 can be electrically coupled together by further source bus which may extend perpendicularly to the source buses 86 and parallel to the source fingers 80 which is positioned adjacent and spaced apart from a distal end of the drain buses 87. Similarly, the drain buses 87 may be electrically coupled together by a further drain bus which extends perpendicularly to the drain buses 86 and parallel to the drain fingers 81 and which is positioned at the opposing side of the active area form the additional source bus. A source contact and a drain contact may be positioned on these additional buses.

Figure 5A:
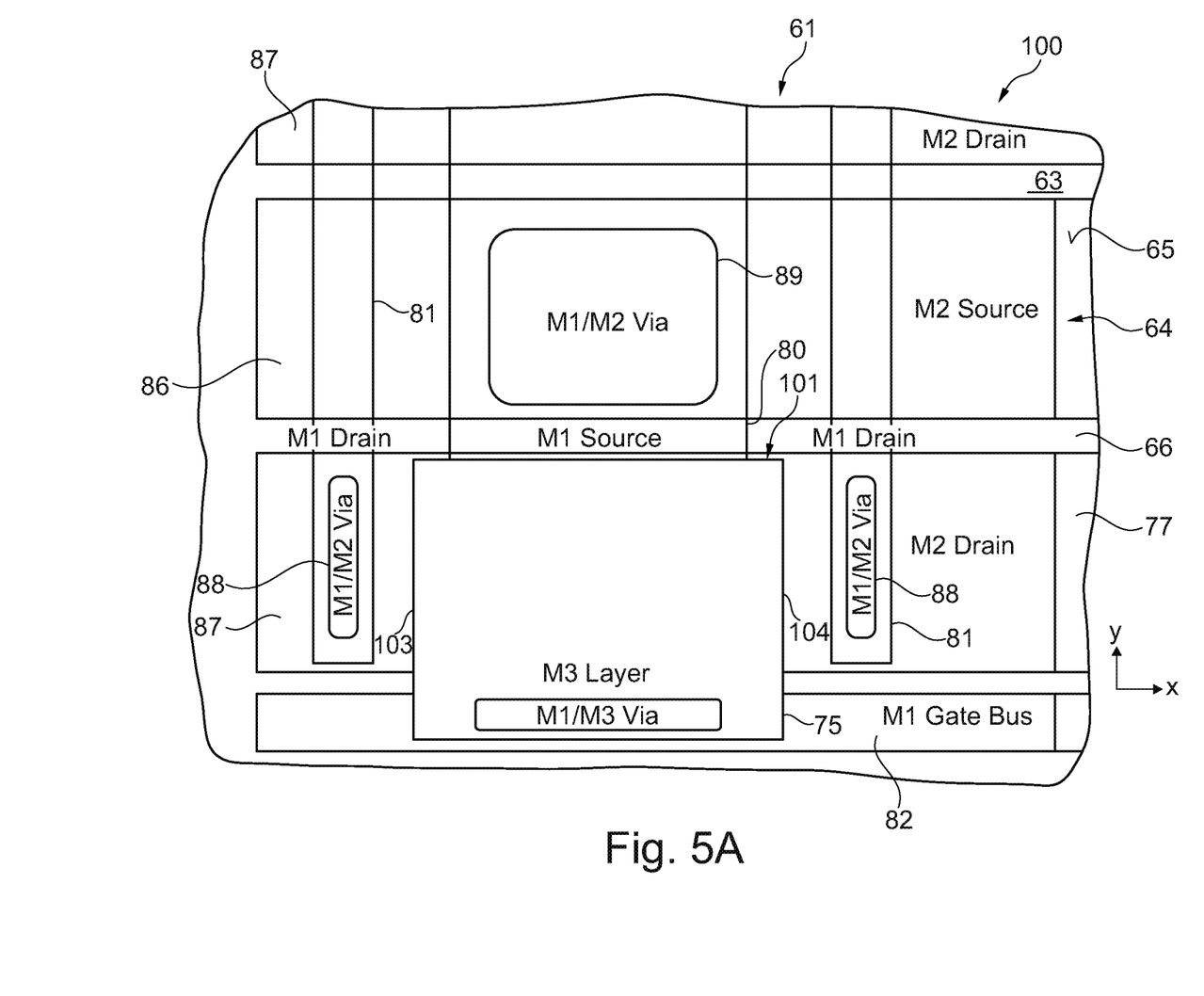
FIGS. 5A and 5B illustrate a plan view and a cross-sectional view, respectively, of a semiconductor device according to an embodiment including a lateral transistor device and a linearizing capacitor.
Figure 5B:
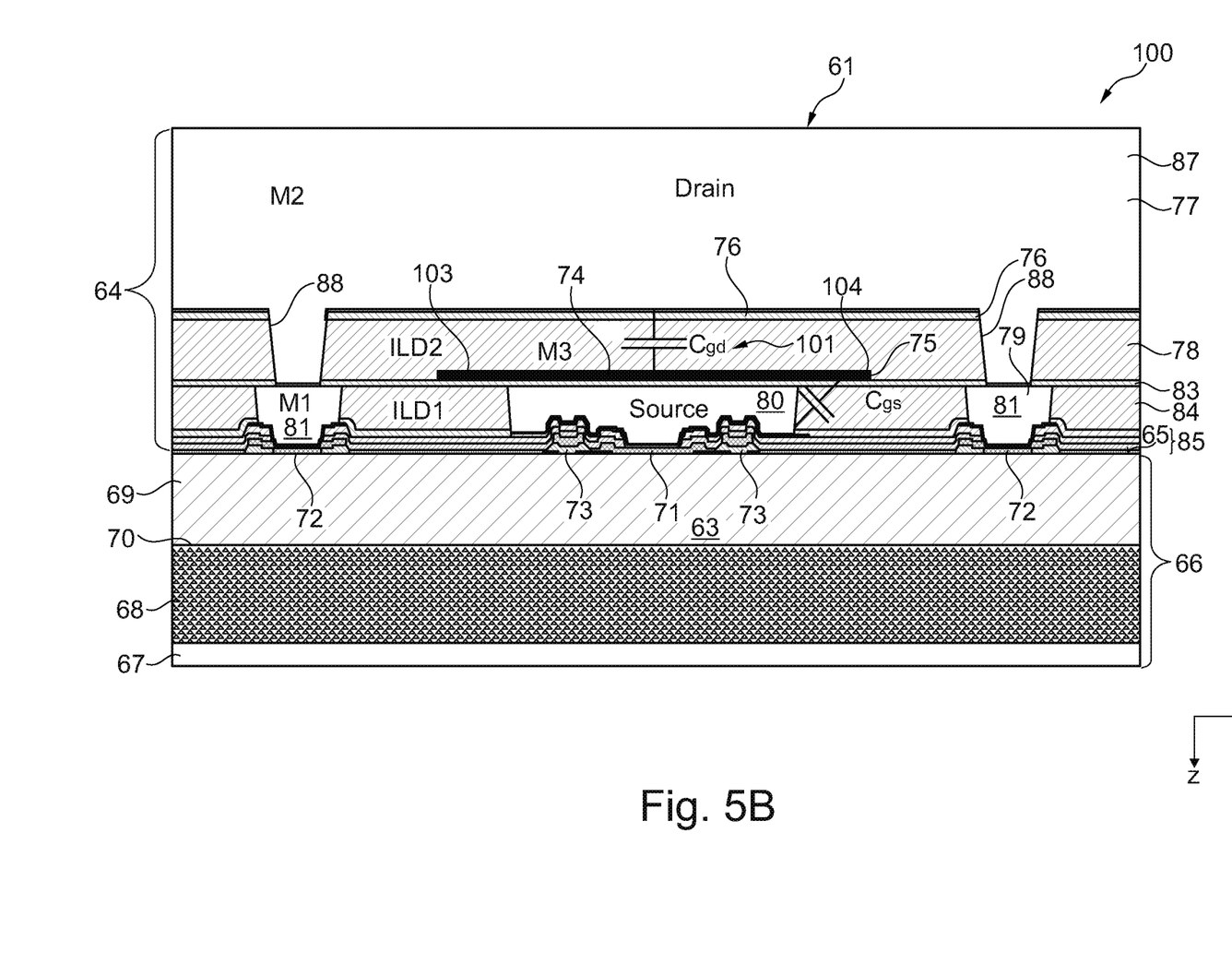

FIGS. 5A and 5B illustrate a plan view and a cross-sectional view, respectively, of a semiconductor device 100 including a lateral transistor device 61 and a linearizing capacitor 101 according to an embodiment.

The lateral transistor device 61 corresponds to the lateral transistor device 61 of the semiconductor device 60 illustrated in FIGS. 3A through 3F. The linearizing capacitor 101 comprises a first plate 74' formed of the first conductive layer 75 which is positioned on the second insulating layer 83 which is in turn positioned on the source finger 80 as in the embodiment illustrated in FIGS. 4A and 4B. The linearizing capacitor 101 also includes the second plate 76 which is formed from the second conductive layer 77 of the metallisation structure 64 as in the embodiment illustrated in FIGS. 4A and 4B. The first plate 74 is spaced apart from the second plate 76 by the first insulating layer 78 to form the structure of the linearizing capacitor 101. The first insulating layer 78 also forms the first interlayer dielectric of the metallisation structure 64.

The linearizing capacitor 101 of the embodiment illustrated in FIGS. 5A and 5B differs from the linearizing capacitor 62 of the embodiment illustrated in FIGS. 4A and 4B in the value of the capacitance provided and in the width of the first plate 74' and also the width of the first plate 74' with respect to the width of the underlying source finger 80.

In the embodiment illustrated in FIGS. 5A and 5B, the first plate 74' has a width in the x direction which is greater than the width in the x direction of the source finger 80 so that the opposing peripheral edges 103, 104 of the first plate 74' are positioned vertically above the third insulating layer 84 which extends between the source fingers 80 and drain fingers 81. The larger overall size of the first plate 74' compared to the first plate 74 in the embodiment illustrated in FIGS. 4A and 4B, leads to an increase in the capacitance of the capacitor 101 compared to the capacitor 62 illustrated in FIGS. 4A and 4B. The position of the peripheral edges 103, 104 above the third insulating layer 84 provides an increased gate source capacitance Ccs compared to the embodiment illustrated in FIGS. 4A and 4B.

As in the embodiment illustrated in FIGS. 4A and 4B, the first plate 74' is electrically coupled to the gate bus 82 by a conductive via 90 which extends between the first plate 74' and the gate bus 82 at a position laterally adjacent to and spaced apart from the distal end of the source finger 80 and the drain fingers 81. The second plate 76 is formed by a portion of the second conductive layer 77 that forms a drain bus 87. As in the embodiment illustrated in FIGS. 4A and 4B, a capacitor 101 may be positioned above some or all of the source fingers 80 of the transistor device 61.

The first plate 74, 74' may include titanium nitride and/or tungsten. The materials of the second insulating layer 83 positioned between the first plate 74, 74' and the underlying source finger 80 and its thickness as well as the material and thickness of the third insulating layer 84 may be selected such that the desired voltage rating of the transistor device is maintained.

For the transistor device 61 of the semiconductor devices 60 and 100, starting from the first surface 65 of the semiconductor body 66, the metallisation structure 64 has a structure formed of the fourth insulating layer 85, the third conductive layer 79 and third insulating layer 84, which are substantially coplanar, the second insulating layer 83, the first conductive layer 75, the first insulating layer 78, and the second conductive layer 77. In some embodiments, the second conductive layer 77 may include two or more sublayers, for example a titanium nitride layer which is positioned on the first insulating layer 78 and a metal layer, for example copper or a copper alloy, which is positioned on the titanium nitride layer. Similarly, the first insulating layer 78 may include two or more sublayers. In some embodiments, first sublayer may comprise silicon oxide and silicon nitride layer may be positioned on the silicon oxide layer.

The first insulating layer 78 and the third insulating layer 84 may be referred to as interlayer dielectrics. The third conductive layer 79 is commonly referred to as the M1 of first metal layer and the second conductive layer 77 is commonly referred to as the second metallic layer M2 the metallisation structure 64. The third insulating layer 84 is the first interlayer dielectric ILD1 and the first insulating layer 78 is the second interlayer dielectric ILD2. In this nomenclature, the first plate 74, 74' may be thought of as third metal layer M3.

Whilst the first plate of the capacitor that is coupled to the gate of the transistor device may be positioned below the second plate that is coupled to the drain of the transistor device in the z direction, the opposite orientation is also possible so that the plate of the capacitor that is coupled to drain is positioned below the plate of the capacitor that is coupled to gate.

To summarise, by monolithically integrating an additional linear capacitor in the metallisation structure applied to the semiconductor device including a lateral transistor device, for example a Group III nitride-based transistor device, and electrically coupling this additional linear capacitor between gate and drain of the lateral transistor device, the combined gate drain capacitance of the transistor device is linearized so that the slew rate of dv/dt is linear allowing the switching speed to be adjusted, for example slowed, to a desired value. The capacitance of the capacitor can be well controlled as the geometry of the capacitor structure can be accurately controlled using photolithographic manufacturing processes used to fabricate the metallisation structure, in particular, the metal layers providing the plates of the capacitor. Additional chip area is not required for the additional capacitor and also no further pins of the package in which the semiconductor device is packaged are required, since the linearizing capacitor is positioned on and electrically coupled with the gate and drain of the transistor structure by the metallization structure itself. Consequently, external high-voltage capacitors can be avoided which avoids parasitic interconnect impedances, reduces the risk of high frequency oscillation and avoids additional variation of dv/dt due to parasitic capacitance.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a lateral transistor device having a source, a drain and a gate;
a semiconductor body having a first surface;
a monolithically integrated capacitor arranged on the first surface of the semiconductor body and electrically coupled between the gate and the drain of the lateral transistor device; and
a metallization structure arranged on the first surface of the semiconductor body,
wherein the lateral transistor device comprises a source finger electrode, a drain finger electrode and a gate finger electrode arranged on the first surface of the semiconductor body, the gate finger electrode being arranged laterally between the source finger electrode and the drain finger electrode,
wherein the capacitor is integrated into the metallization structure and coupled between the gate finger electrode and the drain finger electrode,
wherein the semiconductor device has a reverse transfer capacitance $C_{rss}$,
wherein $C_{rss(Vds=0V)}/C_{rss(Vds=400V)}<50$,
wherein $V_{ds}$ is the drain-source voltage of the lateral transistor device.

2. The semiconductor device of claim 1, wherein the capacitor is arranged on the first surface of the semiconductor body laterally adjacent the source finger electrode, the drain finger electrode and the gate finger electrode.

3. The semiconductor device of claim 1, wherein the capacitor is formed on the first surface of the semiconductor body and comprises a first plate formed from a first conductive layer of the metallization structure, and a second plate formed from a second conductive layer of the metallization structure, and wherein the first plate and the second plate are spaced apart from one another by a first insulation layer of the metallization structure.

4. The semiconductor device of claim 3, wherein:
the first plate of the capacitor extends from a gate runner formed from the first conductive layer, the gate runner being electrically coupled to the gate finger electrode, or the first plate extends from a gate pad formed from the first conductive layer, the gate pad being electrically coupled to the gate finger electrode; and
the second plate of the capacitor extends from a drain bus formed from the second conductive layer, the drain bus being electrically coupled to the drain finger electrode.

5. The semiconductor device of claim 3, wherein the lateral transistor device further comprises an active area that contributes to current switching and the capacitor is positioned above the active area.

6. The semiconductor device of claim 5, wherein the capacitor is arranged at least partially above the source finger electrode.

7. The semiconductor device of claim 6, wherein:
the metallization structure further comprises a third conductive layer, the third conductive layer comprising a source finger arranged on the source finger electrode, a drain finger arranged on the drain finger electrode, and a gate runner positioned laterally adjacent the gate finger electrode, the source finger electrode and the drain finger electrode;
the first conductive layer is arranged above the source finger and insulated from the source finger by a second insulation layer.

8. The semiconductor device of claim 7, wherein:
the second conductive layer comprises alternate drain and source buses that are arranged vertically above the source finger and the drain finger and extend substantially perpendicularly to the source finger and the drain finger;
the source finger is coupled to the source bus by a first conductive via extending through the first insulation layer; and
the drain finger is coupled to the drain bus by a second conductive via extending through the first insulation layer.

9. The semiconductor device of claim 8, further comprising:
- a third insulation layer positioned between the source finger and the drain finger of the third conductive layer; and
- a fourth insulation layer arranged on the first surface that extends between the source finger electrode and the drain finger electrode and covers the gate finger electrode, wherein the third insulation layer is arranged on the fourth insulation layer.

10. The semiconductor device of claim 9, wherein the first conductive layer is coupled to the gate runner by a third conductive via that extends through the third and fourth insulation layers.

11. The semiconductor device of claim 1, wherein the lateral transistor device is a III-V semiconductor transistor device.

12. The semiconductor device of claim 1, wherein the lateral transistor device is a Group III nitride-based transistor device.

13. An inverter, comprising:
- one or more half bridge circuits, each comprising a first switch coupled in series with a second switch, wherein at least one of the first switch and the second switch comprises the semiconductor device of claim 1.

14. The inverter of claim 13, further comprising gate driver circuitry configured to actively control gate current of at least one of the first switch and the second switch.

15. The semiconductor device of claim 1, wherein:
- the lateral transistor device includes a cell field;
- a plurality of source fingers alternately arranged with a plurality of drain fingers are positioned on the first surface of the semiconductor body;
- each of the source fingers and drain fingers are elongated and extend substantially parallel to one another;
- the source fingers are electrically coupled to a common source pad arranged adjacent a first lateral side of the cell field;
- the drain fingers are electrically coupled to a common drain pad arranged on a second lateral side of the cell field opposite the first lateral side by a drain bus; and
- the capacitor is positioned laterally adjacent the cell field and laterally adjacent to an outermost finger of the cell field.

16. The semiconductor device of claim 15, further comprising:
- an ESD protection diode positioned adjacent the cell field and the lateral transistor device, wherein the capacitor is positioned laterally between the cell field and the diode and on the first surface of the semiconductor body.

17. The semiconductor device of claim 15, wherein the capacitor has an elongated shape in plan view.

* * * * *